United States Patent
Peterson et al.

(10) Patent No.: US 12,035,502 B2
(45) Date of Patent: Jul. 9, 2024

(54) CODESIGNED AIR SHROUD

(71) Applicant: Dell Products L.P., Round Rock, TX (US)

(72) Inventors: Chris Everett Peterson, Austin, TX (US); Jyh-Yinn Lin, Taipei (TW); Paul Allen Waters, Austin, TX (US); Evangelos Koutsavdis, Leander, TX (US); Richard Mark Eiland, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 199 days.

(21) Appl. No.: 17/816,159

(22) Filed: Jul. 29, 2022

(65) Prior Publication Data

US 2024/0040738 A1 Feb. 1, 2024

(51) Int. Cl.
*H05K 7/20* (2006.01)
*G10K 11/178* (2006.01)

(52) U.S. Cl.
CPC ... *H05K 7/20145* (2013.01); *G10K 11/17861* (2018.01); *H05K 7/20209* (2013.01); *G10K 2210/11* (2013.01)

(58) Field of Classification Search
CPC .............. H05K 7/20145; H05K 7/20209
See application file for complete search history.

(56) References Cited

U.S. PATENT DOCUMENTS

| | | | |
|---|---|---|---|
| 7,782,612 B2* | 8/2010 | Walsh | H05K 5/0213 165/104.33 |
| 7,929,301 B2* | 4/2011 | Fong | H05K 5/063 363/141 |
| 8,701,821 B2* | 4/2014 | O'Coimin | H05K 7/20736 181/224 |
| 10,856,434 B2* | 12/2020 | Waters | H05K 7/20727 |
| 11,388,837 B2* | 7/2022 | Waters | G10K 11/16 |
| 2006/0104027 A1* | 5/2006 | Vinson | G06F 1/20 361/695 |
| 2022/0095480 A1* | 3/2022 | Waters | G10K 11/172 |
| 2023/0232570 A1* | 7/2023 | Carey | G11B 33/142 361/679.33 |

* cited by examiner

*Primary Examiner* — Adrian S Wilson
(74) *Attorney, Agent, or Firm* — McDermott Will & Emery LLP (57) ABSTRACT

Embodiments may be directed to a codesigned shroud for a chassis comprising a plurality of components and a plurality of fans generating a plurality of airflows to cool the plurality of components. The codesigned shroud may have a plurality of walls defining a plurality of channels, wherein at least two walls of the plurality of walls define each channel of the plurality of channels. Each channel may be aligned with a direction of an airflow of the plurality of airflows. At least one channel includes a set of baffles oriented substantially perpendicular to the direction of an airflow in the channel. Each baffle may be formed with acoustically absorbent material to absorb acoustic energy that could affect performance of a component, wherein a first baffle of the set of baffles is offset from a second baffle of the set of baffles.

20 Claims, 4 Drawing Sheets

CODESIGNED AIR SHROUD

BACKGROUND

Field of the Disclosure

This disclosure relates generally to information handling systems and more particularly to systems for cooling components in a chassis and protecting components from acoustic energy.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

In one or more embodiments may be generally directed to a codesigned shroud for a chassis comprising a plurality of components and a plurality of fans generating a plurality of airflows to cool the plurality of components. A codesigned shroud may comprise a plurality of walls defining a plurality of channels, wherein at least two walls of the plurality of walls define each channel of the plurality of channels, wherein each channel is substantially aligned with a direction of an airflow of the plurality of airflows and a set of baffles in a noise attenuation channel of the plurality of channels, the set of baffles oriented substantially perpendicular to the direction of an airflow in the noise attenuation channel, wherein each baffle comprises acoustically absorbent material, wherein a first baffle of the set of baffles is offset from a second baffle of the set of baffles.

In some embodiments, the acoustically absorbent material is configured to absorb acoustic energy in a frequency associated with a component. In some embodiments, a component of the plurality of components is configurable to process information at a processing speed in a range of processing speeds, a fan produces the acoustic energy at a frequency of a range of frequencies, the component is subject to a decrease in the processing speed due to the acoustic energy produced at the frequency, and the acoustically absorbent material is configured to absorb at least a portion of the acoustic energy at the frequency. In some embodiments, the component comprises a Hard Disk Drive (HDD).

In some embodiments, at least one channel of the plurality of channels is configured to direct an airflow of the plurality of airflows to cool a heat sink. In some embodiments, at least one channel of the plurality of channels is configured to direct an airflow of the plurality of airflows to cool a set of memory components. In some embodiments, at least one channel of the plurality of channels is configured to direct a first airflow to an upper portion of the chassis, wherein a second channel of the plurality of channels is configured to direct a second airflow of the plurality of airflows to cool a set of memory components in a lower portion of the chassis.

In some embodiments, a first baffle of the plurality of baffles has a first height and a second baffle of the plurality of baffles has a second height, wherein a combined height of the first baffle height and the second baffle height is substantially equal to a height of the noise attenuation channel. In some embodiments, at least one baffle of the plurality of baffles comprises a plurality of openings oriented perpendicular to the direction of the airflow.

In some embodiments, a codesigned shroud further comprises acoustically absorbent material applied to one or more of the plurality of walls.

BRIEF DESCRIPTION OF THE DRAWINGS

For a more complete understanding of the present disclosure and its features/advantages, reference is now made to the following description, taken in conjunction with the accompanying drawings, which are not drawn to scale, and in which.

DETAILED DESCRIPTION

In the following description, details are set forth by way of example to facilitate discussion of the disclosed subject matter. It should be apparent to a person of ordinary skill in the field, however, that the disclosed embodiments are examples and not exhaustive of all possible embodiments.

As used herein, a reference numeral refers to a class or type of entity, and any letter following such reference numeral refers to a specific instance of a particular entity of that class or type. Thus, for example, a hypothetical entity referenced by '12A' may refer to a particular instance of a particular class/type, and the reference '12' may refer to a collection of instances belonging to that particular class/type or any one instance of that class/type in general.

An information handling system (IHS) may include a hardware resource or an aggregate of hardware resources operable to compute, classify, process, transmit, receive, retrieve, originate, switch, store, display, manifest, detect, record, reproduce, handle, and/or utilize various forms of information, intelligence, or data for business, scientific, control, entertainment, or other purposes, according to one or more embodiments. For example, an IHS may be a personal computer, a desktop computer system, a laptop computer system, a server computer system, a mobile device, a tablet computing device, a personal digital assistant (PDA), a consumer electronic device, an electronic music player, an electronic camera, an electronic video player, a wireless access point, a network storage device, or another suitable device and may vary in size, shape, performance, functionality, and price. In one or more embodiments, a portable IHS may include or have a form factor of that of or similar to one or more of a laptop, a notebook, a telephone, a tablet, and a PDA, among others. For example, a portable IHS may be readily carried and/or transported by a user (e.g., a person). In one or more embodiments, components of an IHS may include one or more storage devices, one or more communications ports for communicating with external devices as well as various input and output (I/O) devices, such as a keyboard, a mouse, and a video display, among others. In one or more embodiments, IHS may include one or more buses operable to transmit communication between or among two or more hardware components. In one example, a bus of an IHS may include one or more of a memory bus, a peripheral bus, and a local bus, among others. In another example, a bus of an IHS may include one or more of a Micro Channel Architecture (MCA) bus, an Industry Standard Architecture (ISA) bus, an Enhanced ISA (EISA) bus, a Peripheral Component Interconnect (PCI) bus, HyperTransport (HT) bus, an inter-integrated circuit ($I^2C$) bus, a serial peripheral interface (SPI) bus, a low pin count (LPC) bus, an enhanced serial peripheral interface (eSPI) bus, a universal serial bus (USB), a system management bus (SMBus), and a Video Electronics Standards Association (VESA) local bus, among others.

In one or more embodiments, an IHS may include firmware that controls and/or communicates with one or more hard drives, network circuitry, one or more memory devices, one or more I/O devices, and/or one or more other peripheral devices. For example, firmware may include software embedded in an IHS component utilized to perform tasks. In one or more embodiments, firmware may be stored in non-volatile memory, such as storage that does not lose stored data upon loss of power. In one example, firmware associated with an IHS component may be stored in non-volatile memory that is accessible to one or more IHS components. In another example, firmware associated with an IHS component may be stored in non-volatile memory that may be dedicated to and includes part of that component. For instance, an embedded controller may include firmware that may be stored via non-volatile memory that may be dedicated to and includes part of the embedded controller.

An IHS may include a processor, a volatile memory medium, non-volatile memory media, an I/O subsystem, and a network interface. Volatile memory medium, non-volatile memory media, I/O subsystem, and network interface may be communicatively coupled to processor. In one or more embodiments, one or more of volatile memory medium, non-volatile memory media, I/O subsystem, and network interface may be communicatively coupled to processor via one or more buses, one or more switches, and/or one or more root complexes, among others. In one example, one or more of a volatile memory medium, non-volatile memory media, an I/O subsystem, a network interface may be communicatively coupled to the processor via one or more PCI-Express (PCIe) root complexes. In another example, one or more of an I/O subsystem and a network interface may be communicatively coupled to processor via one or more PCIe switches.

In one or more embodiments, the term "memory medium" may mean a "storage device", a "memory", a "memory device", a "tangible computer readable storage medium", and/or a "computer-readable medium". For example, computer-readable media may include, without limitation, storage media such as a direct access storage device (e.g., a hard disk drive, a floppy disk, etc.), a sequential access storage device (e.g., a tape disk drive), a compact disk (CD), a CD-ROM, a digital versatile disc (DVD), a random access memory (RAM), a read-only memory (ROM), a one-time programmable (OTP) memory, an electrically erasable programmable read-only memory (EEPROM), and/or a flash memory, a solid state drive (SSD), or any combination of the foregoing, among others.

In one or more embodiments, one or more protocols may be utilized in transferring data to and/or from a memory medium. For example, the one or more protocols may include one or more of small computer system interface (SCSI), Serial Attached SCSI (SAS) or another transport that operates with the SCSI protocol, advanced technology attachment (ATA), serial ATA (SATA), a USB interface, an Institute of Electrical and Electronics Engineers (IEEE) 1394 interface, a Thunderbolt interface, an advanced technology attachment packet interface (ATAPI), serial storage architecture (SSA), integrated drive electronics (IDE), or any combination thereof, among others.

A volatile memory medium may include volatile storage such as, for example, RAM, DRAM (dynamic RAM), EDO RAM (extended data out RAM), SRAM (static RAM), etc. One or more of non-volatile memory media may include nonvolatile storage such as, for example, a read only memory (ROM), a programmable ROM (PROM), an erasable PROM (EPROM), an electrically erasable PROM, NVRAM (non-volatile RAM), ferroelectric RAM (FRAM), a magnetic medium (e.g., a hard drive, a floppy disk, magnetic tape, etc.), optical storage (e.g., a CD, a DVD, a BLU-RAY disc, etc.), flash memory, a SSD, etc. In one or more embodiments, a memory medium can include one or more volatile storages and/or one or more nonvolatile storages.

In one or more embodiments, a network interface may be utilized in communicating with one or more networks and/or one or more other information handling systems. In one example, network interface may enable an IHS to communicate via a network utilizing a suitable transmission protocol and/or standard. In a second example, a network interface may be coupled to a wired network. In a third example, a network interface may be coupled to an optical network. In another example, a network interface may be coupled to a wireless network. In one instance, the wireless network may include a cellular telephone network. In a second instance, the wireless network may include a satellite telephone network. In another instance, the wireless network may include a wireless Ethernet network (e.g., a Wi-Fi network, an IEEE 802.11 network, etc.).

In one or more embodiments, a network interface may be communicatively coupled via a network to a network storage resource. For example, the network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, an Internet or another appropriate architecture or system that facilitates the communication of signals, data and/or messages (generally referred to as data). For instance, the network may transmit data utilizing a desired storage and/or communication protocol, including one or more of Fibre Channel, Frame Relay, Asynchronous Transfer Mode (ATM), Internet protocol (IP), other packet-based protocol, Internet SCSI (iSCSI), or any combination thereof, among others.

In one or more embodiments, a processor may execute processor instructions in implementing at least a portion of one or more systems, at least a portion of one or more flowcharts, at least a portion of one or more methods, and/or at least a portion of one or more processes. In one example, a processor may execute processor instructions from one or more memory media in implementing at least a portion of one or more systems, at least a portion of one or more flowcharts, at least a portion of one or more methods, and/or at least a portion of one or more processes. In another example, a processor may execute processor instructions via a network interface in implementing at least a portion of one or more systems, at least a portion of one or more flowcharts, at least a portion of one or more methods, and/or at least a portion of one or more processes.

In one or more embodiments, a processor may include one or more of a system, a device, and an apparatus operable to interpret and/or execute program instructions and/or process data, among others, and may include one or more of a microprocessor, a microcontroller, a digital signal processor (DSP), an application specific integrated circuit (ASIC), and another digital or analog circuitry configured to interpret and/or execute program instructions and/or process data, among others. In one example, a processor may interpret and/or execute program instructions and/or process data stored locally (e.g., via memory media and/or another component of an IHS). In another example, a processor may interpret and/or execute program instructions and/or process data stored remotely (e.g., via a network storage resource).

In one or more embodiments, an I/O subsystem may represent a variety of communication interfaces, graphics interfaces, video interfaces, user input interfaces, and/or peripheral interfaces, among others. For example, an I/O subsystem may include one or more of a touch panel and a display adapter, among others. For instance, a touch panel may include circuitry that enables touch functionality in conjunction with a display that is driven by a display adapter.

A non-volatile memory medium may include an operating system (OS) and applications (APPs). In one or more embodiments, one or more of an OS and APPs may include processor instructions executable by a processor. In one example, a processor may execute processor instructions of one or more of OS and APPs via a non-volatile memory medium. In another example, one or more portions of the processor instructions of one or more of an OS and APPs may be transferred to a volatile memory medium and a processor may execute the one or more portions of the processor instructions.

Non-volatile memory medium may include information handling system firmware (IHSFW). In one or more embodiments, IHSFW may include processor instructions executable by a processor. For example, IHSFW may include one or more structures and/or one or more functionalities of and/or compliant with one or more of a basic input/output system (BIOS), an Extensible Firmware Interface (EFI), a Unified Extensible Firmware Interface (UEFI), and an Advanced Configuration and Power Interface (ACPI), among others. In one instance, a processor may execute processor instructions of IHSFW via non-volatile memory medium. In another instance, one or more portions of the processor instructions of IHSFW may be transferred to volatile memory medium, and processor may execute the one or more portions of the processor instructions of IHSFW via volatile memory medium.

Figure 1:
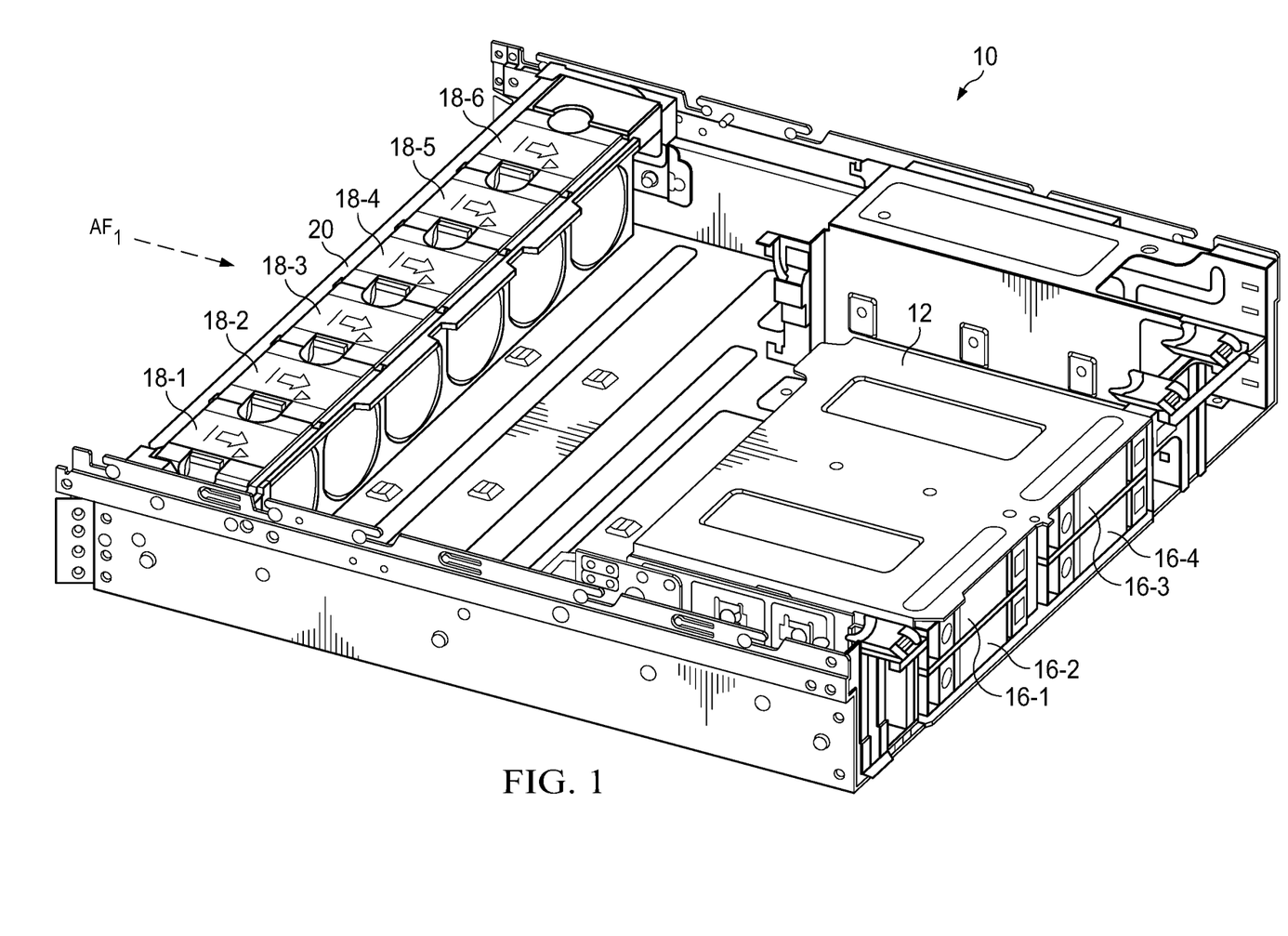
FIG. 1 depicts an example of an information handling system in a chassis having multiple fans generating multiple airflows.

Turning now to FIG. 1, an example of an information handling system is illustrated, according to one or more embodiments. A chassis 10 may include a plurality of fans 18 for generating airflows to cool components (not shown) including processors (e.g., CPUs and GPUs) or heat sinks coupled to the processors, memory such as media, I/O components and network components. Each fan 18 generates an airflow, wherein the components may be located downstream of fans 18. Components such as Hard Disk Drives (HDDs) 16 may be installed in enclosure 12 to isolate HDDs 16 from vibration.

The operation of fans 18 may be necessary to cool components the various components, but their operation may negatively affect the performance of certain components. For example, components such as Hard Disk Drives 16 may operate to process information at a processing speed in a range of processing speeds. However, HDDs 16 may be subject to a decrease in the processing speed due to acoustic energy at certain frequencies. A fan 18 generating an airflow to cool the HDDs 16 produces acoustic energy at a frequency over a range of frequencies. Acoustic energy (e.g., noise) may be produced by a fan 18 generating an airflow due to the fan blades slicing through air. Also, a fan 18 may produce noise because sound pressure scales with the $5^{th}$ power of fan speed (measured in revolutions per minute or RPM). Some of these frequencies may negatively affect the performance of the HDDs 16. Acoustic energy generally travels along a direct path (e.g., in a straight line) from a source.

Embodiments described herein may include a codesigned shroud capable of acoustical and/or vibration attenuation to address dynamics requirements of acoustically sensitive components such as HDDs 16 and also capable of balancing airflows between a plurality of channels to improve cooling of all components in chassis 10.

Figure 2:
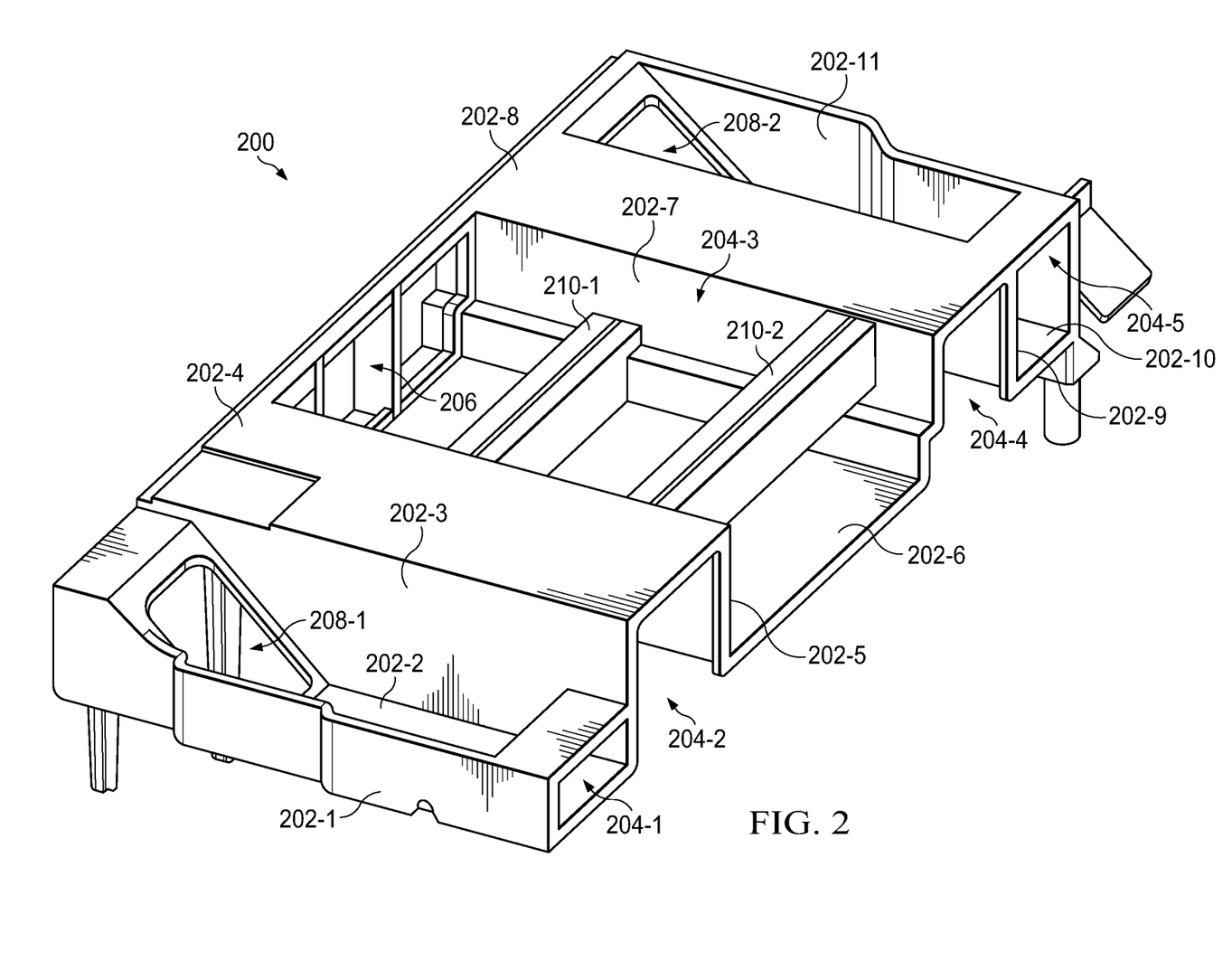
FIG. 2 depicts a perspective view of a shroud for directing airflows in a chassis and having a noise attenuation channel with a set of baffles for acoustic noise reduction, in accordance with some embodiments.

Referring to FIG. 2, embodiments of a cooling system may include shroud 200 comprising openings 206 for receiving cool airflow and a plurality of walls 202 defining a plurality of channels 204, wherein at least two walls (e.g., walls 202-1, 202-2, 202-3) of the plurality of walls 202 form part of a channel (e.g., 204-1) of the plurality of channels 204, wherein each channel 204 is substantially aligned with a direction of an airflow of the plurality of airflows. In some embodiments, a cover (not shown) forms a part of one or more channels 204. In some embodiments, a channel 204 may be associated with a single fan 18. In some embodiments, a channel 204 may receive airflows from two or more fans 18 or a portion of a single fan 18.

Channels Divide Airflows for Targeted Cooling—Components

As depicted in FIG. 2, walls 202-1, 202-2 and 202-3 may form part of channel 204-1 for directing an airflow or a portion of an airflow to cool a first set of components in chassis 10. In some embodiments, channel 204-1 may have opening 208-1 to allow airflow into an upper portion of chassis 10. In some embodiments, channel 204-1 may not have opening 208-1 such that channel 204-1 guides airflow into a lower portion of chassis 10. Walls 202-9, 202-10 and 202-11 may form part of channel 204-5 for directing an airflow or a portion of an airflow to cool a second set of components in chassis 10. In some embodiments, channel 204-5 may have opening 208-2 to allow airflow into an upper portion of chassis 10. In some embodiments, channel 204-5 may not have opening 208-2 such that channel 204-5 guides airflow into a lower portion of chassis 10, discussed in greater detail below.

Channels Divide Airflows for Targeted Cooling—Heat Sink Cooling

Also depicted in FIG. 2, walls 202-3, 202-4 and 202-5 may form part of channel 204-2 for directing an airflow or a portion of an airflow to cool a first heat sink (not shown) and walls 202-7, 202-8 and 202-9 may form part of channel 204-4 for directing an airflow or a portion of an airflow to cool a second heat sink (not shown). Channels 202-2 and 202-4 may ensure a volumetric flow rate of airflow around a heat sink and allow a fan 18 associated with cooling a heat sink to operate at a lower fan speed to reduce the amount of acoustic energy that could affect HDDs 16, discussed in greater detail below.

Channels Divide Airflows for Targeted Cooling—Noise Attenuation Channel

Also depicted in FIG. 2, walls 202-5, 202-6 and 202-7 may form part of noise attenuation channel 204-3 for directing an airflow or a portion of an airflow to cool a set of HDDs 16, wherein noise attenuation channel 204-3 comprises a set of baffles 210 oriented substantially perpendicular to the direction of an airflow and at least two baffles 210 are offset from each other, discussed below in more detail.

Each baffle 210 comprises acoustic energy absorbent material. As mentioned above, fans 18 produce acoustic energy at a frequency in a range of frequencies. In some embodiments, the acoustically absorbent material is configured to absorb at least a portion of the acoustic energy at a frequency or a range of frequencies that could negatively affect the performance of a component. In some embodiments, the acoustically absorbent material is configured to absorb at least a portion of the acoustic energy at a frequency or a range of frequencies that could negatively affect the performance of HDDs 16.

Airflow Balancing and Acoustic Attenuation

Some chassis 10 may have shrouds and/or baffles for airflow management. However, there are often components downstream of these airflow management features that require acoustical and/or vibration attenuation. Materials for attenuation and/or the space required for the materials may impede airflow, and space constraints may lead to airflow channels being narrower than others.

Figure 3:
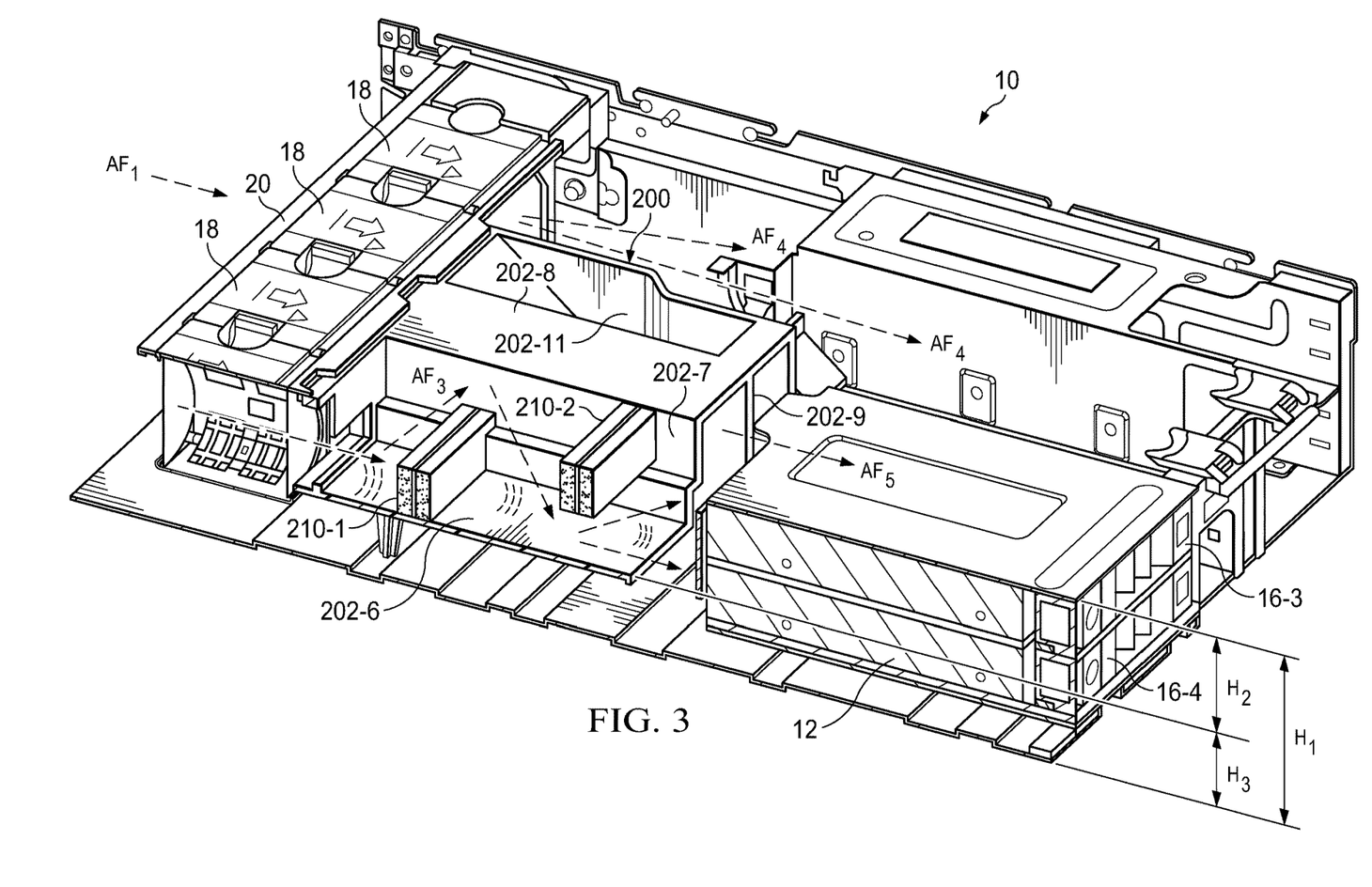
FIG. 3 depicts a partial perspective view of a chassis with a shroud for directing airflows and having a noise attenuation channel with a set of baffles for acoustic noise reduction, in accordance with some embodiments.
Figure 4:
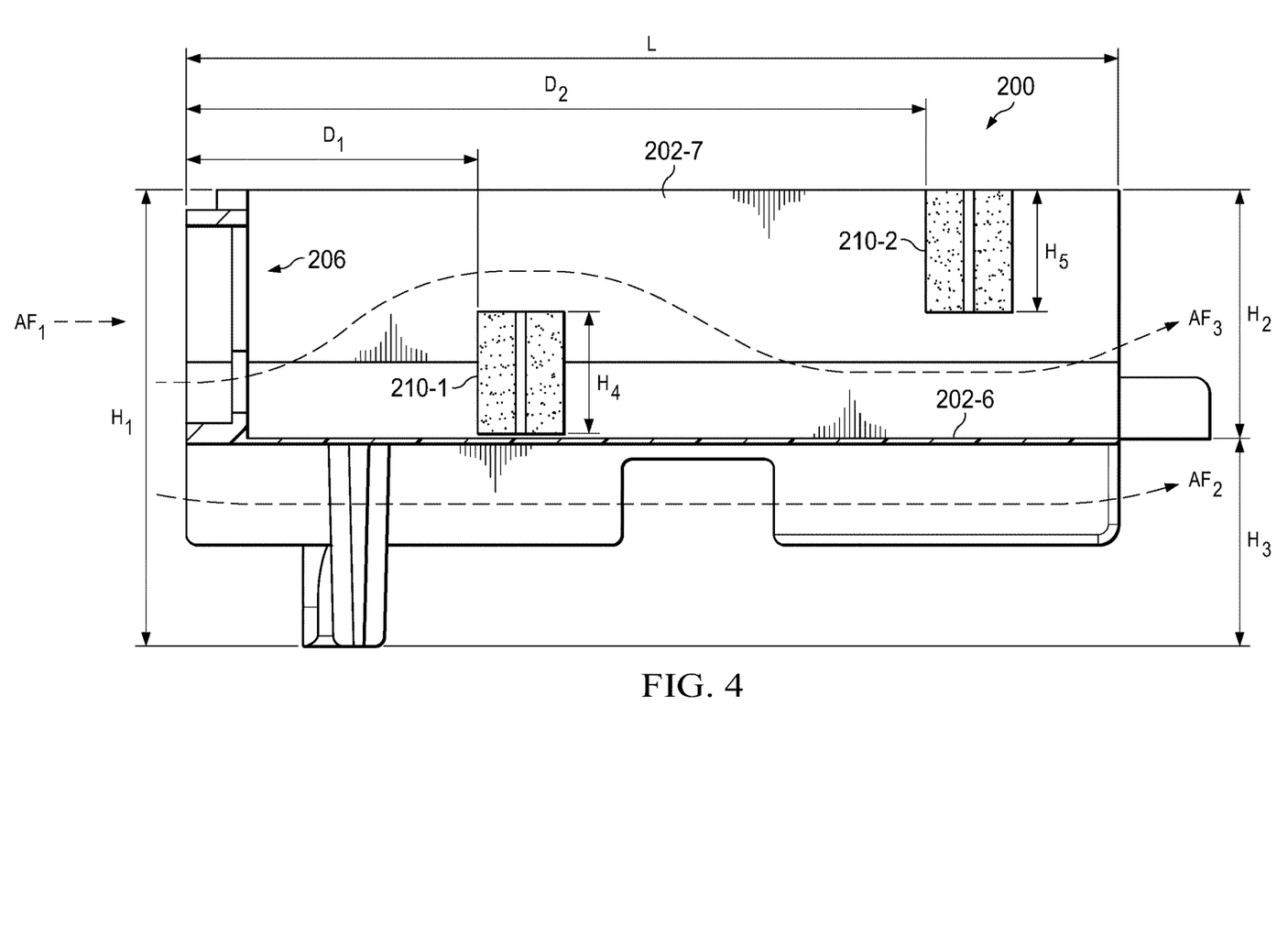
FIG. 4 depicts a cutaway side view of a portion of a shroud for directing airflows and having a noise attenuation channel with a set of baffles for acoustic noise reduction, in accordance with some embodiments.

Referring to FIG. 3 and FIG. 4, embodiments may balance multiple airflows to ensure all components in chassis 10 are cooled and attenuate acoustic energy produced either directly or indirectly by fans 18 that could otherwise negatively affect the performance of HDDs 16.

Fans 18 may operate to draw cool air into chassis 10 as an airflow denoted $AF_1$. Each fan 18 may operate at a fan speed independent of other fans 18. In some embodiments, each fan 18 may be communicatively coupled to a controller (not shown), wherein the controller may determine a fan speed independently of other fan speeds.

As airflow $AF_1$ enters shroud 200, airflow $AF_1$ may be divided into multiple airflows by channels 204.

In some embodiments, chassis 10 may have an overall height ($H_1$) but be divided into an upper portion associated with height $H_2$ and a lower portion associated with height $H_3$. A set of components including HDDs 16 may be located in an upper (1U) portion and other components (e.g., media) may be located in a lower (1U) portion, wherein chassis 10 may be referred to as a 2U chassis 10.

One or more channels 204 (e.g., channels 204-1 and 204-5) may direct airflow $AF_2$ to a lower portion of chassis 10. The lower portion of chassis 10 may contain memory or other components that require a lower volumetric airflow rate for cooling (as compared to the upper portion) such that a fan 18 generating airflow $AF_2$ may operate at a lower fan speed, resulting in the fan 18 producing less acoustic energy that could affect the performance of HDDs 16.

One or more channels 204 (e.g., channels 204-2 and 204-4) may direct airflow $AF_5$ to cool a heatsink. In some embodiments, channels 202-2 and 202-4 may be positioned over a heat sink to ensure airflow $AF_5$ contacts the heat sink. A heat sink may function as an acoustic diffuser such that acoustic energy produced by a fan 18 generating airflow $AF_5$ is at least partially diffused by the heat sink. In some embodiments, channels 202-2 and 202-4 may be configured to direct a portion of airflow $AF_5$ to cool a set of HDDs 16, wherein the heat sink at least partially diffuses acoustic energy that could negatively affect HDDs 16. In some embodiments, channels 202-2 and 202-4 may be configured to direct airflow $AF_5$ around a set of HDDs 16, wherein heated air exiting channels 202-2 and 202-4 does not contact HDDs 16 and acoustic noise produced by a fan 18 generating airflow $AF_5$ is not directed at HDDs 16. Thus, a fan 18 operating to cool a heat sink may operate at a fan speed based on cooling the heat sink independently of a fan generating airflow $AF_2$ and without negatively affecting the performance of HDDs 16.

Noise attenuation channel 204-3 may be configured to direct airflow $AF_3$ to cool a set of HDDs 16 and to reduce the amount of acoustic energy that reaches HDDs 16. As depicted in FIG. 4, in some embodiments, noise attenuation channel 204-3 may be configured with a set of baffles 210 oriented substantially perpendicular to a direction of airflow $AF_3$. The dimensions of each baffle 210, the number of baffles 210 and the position of each baffle 210 may depend on one or more of the dimensions (e.g., length (L), height ($H_2$) and width) of noise attenuation channel 204-3, the volumetric flow rate of airflow $AF_3$ needed to cool a set of HDDs 16 and the properties of acoustically absorbent material used to form each baffle 210. As depicted in FIG. 4, a first baffle 210-1 may have a first baffle height $H_4$ and be positioned a first distance $D_1$ from an edge of shroud 200 and a second baffle 210-2 may have a second baffle height $H_5$ and be positioned a second distance $D_2$ from an edge of shroud 200.

Offset Baffles Prevent Direct Path for Acoustic Energy

Referring to FIG. 4, first baffle 210-1 may be located proximate to wall 202-6 and extend height $H_4$. Second baffle 210-2 may be offset from first baffle 210-1 and extend height $H_5$, wherein the combined heights (e.g., $H_4$ and $H_5$) may be equal to, approximately equal to, less than or greater than height $H_2$ of noise attenuation channel 204-3. Offset baffles 210 allow a fan 18 to generate airflow $AF_3$ with a volumetric flow rate to cool a set of HDDs 16 but do not provide a direct path for acoustic energy produced by the fan 18 to travel to HDDs 16.

In some embodiments, shroud 200 may allow airflow $AF_4$ to flow through chassis 10 to provide general cooling of chassis 10. However, one or more walls (e.g., wall 202-11) may ensure acoustic energy produced by a fan 18 generating airflow $AF_4$ does not have a direct path to HDDs 16.

Testing of embodiments conformed the improved cooling and reduced acoustic energy effects over systems with no shroud, systems with foam material attached to a shroud surface and systems with a channel having a single front or rear muffler. Benchmark testing as well as testing of various embodiments involved fans 18 operating at approximately 71% maximum fan speed. Any increase in sound pressure indicated the acoustic energy might affect the performance of an HDD 16.

Benchmark Testing

Benchmark testing of chassis 10 without any airflow balancing or noise attenuation indicated fans 18 were capable of generating a volumetric flow rate of 120 CFM (cubic feet per minute) but the associated acoustic energy produced by the fans 18 resulted in all HDDs experiencing an increase in sound pressure of at least 0.9 dB (with at least one HDD 16 experiencing an increase of 2.5 dB) due to acoustic energy produced by fans 18. Thus, all four HDDs 16 were subjected to acoustic energy that could affect their performance, with at least one HDD 16 expected to be negatively affected.

Benchmark testing of chassis 10 with airflow balancing and acoustically absorbent material applied as a foam to a surface of shroud (but without baffles 210) indicated fans 18 were capable of generating a volumetric flow rate of 120 CFM (cubic feet per minute) but the associated acoustic energy produced by the fans 18 resulted in all HDDs 16 experiencing an increase in sound pressure of at least 0.2 dB (with at least one HDD 16 experiencing an increase of 1.4 dB) due to acoustic energy produced by fans 18. Thus, all four HDDs 16 were subjected to acoustic energy that could affect their performance.

In another benchmark test, chassis 10 was configured with a single muffler near HDDs 16. Notably, the dimensions of the single muffler needed to prevent acoustic energy from having a direct path to HDDs 16 resulted in an approximately 10% decrease in volumetric air flow. Furthermore, the associated acoustic energy produced by the fans 18 resulted in all four HDDs 16 experiencing an increase in sound pressure of at least 1.8 dB (with at least one HDD 16 experiencing an increase of 4.2 dB). Thus, chassis 10 having a single muffler may not protect HDDs 16 from acoustic energy such that an information handling system in chassis 10 may not be able to perform at higher processing speeds.

Testing

Embodiments, include variations described below, indicated that a codesigned shroud 200 capable of airflow balancing and acoustic energy attenuation may enable HDDs 16 and other components sensitive to acoustic energy to operate at higher processing speeds even when fans 18 are producing acoustic energy at a frequency that would otherwise negatively affect their performance.

Variations

In some embodiments, a layer of acoustically absorbent material (not shown) may be applied to one or more walls 202. For example, the layer of acoustically absorbent material may be a foam material having a thickness of 6 mm, 13 mm or some other thickness and be applied to walls 202. In some embodiments, one or more baffles 210 may be perforated (e.g., comprise a plurality of openings). The layer of acoustically absorbent material may be the same or different than the acoustically absorbent material forming baffles 210.

Testing of chassis 10 with shroud 200 configured with channels 204 to provide airflow balancing and a set of baffles 210 in which acoustically absorbent material with a thickness of 13 mm is applied to shroud 200, first baffle 210-1 is perforated (e.g., comprises a plurality of openings) and second baffle 210-2 is solid (e.g., comprises acoustically absorbent material) indicated fans 18 were capable of generating a volumetric flow rate of 120 CFM (cubic feet per minute). The associated acoustic energy produced by the fans 18 resulted in three HDDs 16 experiencing a decrease in sound pressure of at least 0.1 dB (with at least one HDD 16 experiencing a decrease of 0.5 dB). One HDD 16 experienced an increase of 0.8 dB. Thus, three out of four HDDs 16 in chassis 10 may not be affected by acoustic energy and may be able to perform at higher processing speeds.

Testing of chassis 10 with shroud 200 configured with channels 204 to provide airflow balancing and a set of baffles 210 in which acoustically absorbent material with a thickness of 13 mm is applied to shroud 200, first baffle 210-1 and second baffle 210-2 are solid indicated fans 18 were capable of generating a volumetric flow rate of 120 CFM (cubic feet per minute). The associated acoustic energy produced by the fans 18 resulted in one HDD 16 experiencing no change in sound pressure and two HDDs 16 experiencing a decrease in sound pressure of at least 0.3 dB (with at least one HDD 16 experiencing a decrease of 0.4 dB). One HDD 16 experienced an increase of 0.9 dB. Thus, three out of four HDDs 16 in chassis 10 may not be affected by acoustic energy and may be able to perform at higher processing speeds.

Testing of chassis 10 with shroud 200 configured with channels 204 to provide airflow balancing and a set of baffles 210 in which acoustically absorbent material with a thickness of 6 mm is applied to shroud 200, first baffle 210-1 is perforated (e.g., comprises a plurality of openings) and second baffle 210-2 is solid (e.g., comprises acoustically absorbent material) indicated fans 18 were capable of generating a volumetric flow rate of 120 CFM (cubic feet per minute). The associated acoustic energy produced by the fans 18 resulted in two HDDs 16 experiencing a decrease in sound pressure of at least 0.1 dB (with at least one HDD 16 experiencing a decrease of 0.4 dB). Of the other two HDDs 16, one HDD 16 experienced an increase of 0.1 dB and the other HDD 16 experienced an increase of 1.1 dB. Chassis 10 having two out of four HDDs 16 not affected by acoustic energy and a third HDD minimally affected by acoustic energy may be able to perform at higher processing speeds.

Testing of chassis 10 with shroud 200 configured with channels 204 to provide airflow balancing and a set of baffles 210 in which acoustically absorbent material with a thickness of 6 mm is applied to shroud 200 and first baffle 210-1 and second baffle 210-2 are solid indicated fans 18 were capable of generating a volumetric flow rate of 120 CFM (cubic feet per minute). The associated acoustic energy produced by the fans 18 resulted in two HDDs 16 experiencing a decrease in sound pressure of at least 0.3 dB (with at least one HDD 16 experiencing a decrease of 0.4 dB). Of the other two HDDs 16, one HDD 16 experienced an increase of 0.1 dB and the other HDD 16 experienced an increase of 1.1 dB. Chassis 10 having two out of four HDDs 16 not affected by acoustic energy and a third HDD minimally affected by acoustic energy may be able to perform at higher processing speeds.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A codesigned shroud for a chassis comprising a plurality of components and a plurality of fans generating a plurality of airflows to cool the plurality of components, the codesigned shroud comprising:
   a plurality of walls defining a plurality of channels, wherein at least two walls of the plurality of walls define each channel of the plurality of channels, wherein each channel is substantially aligned with a direction of an airflow of the plurality of airflows; and
   a set of baffles in a noise attenuation channel of the plurality of channels, the set of baffles oriented substantially perpendicular to the direction of an airflow in the noise attenuation channel, wherein each baffle comprises acoustically absorbent material, wherein a first baffle of the set of baffles is offset from a second baffle of the set of baffles.

2. The codesigned shroud of claim 1, wherein the baffle comprises acoustically absorbent material configured to absorb acoustic energy in a frequency associated with a component.

3. The codesigned shroud of claim 2, wherein
   a component of the plurality of components is configurable to process information at a processing speed in a range of processing speeds;
   a fan produces the acoustic energy at a frequency of a range of frequencies,
   the component is subject to a decrease in the processing speed due to the acoustic energy produced at the frequency; and
   the acoustically absorbent material is configured to absorb at least a portion of the acoustic energy at the frequency.

4. The codesigned shroud of claim 3, wherein the component comprises a Hard Disk Drive (HDD).

5. The codesigned shroud of claim 1, wherein at least one channel of the plurality of channels is configured to direct an airflow of the plurality of airflows to cool a heat sink.

6. The codesigned shroud of claim 1, wherein at least one channel of the plurality of channels is configured to direct an airflow of the plurality of airflows to cool a set of memory components.

7. The codesigned shroud of claim 6, wherein at least one channel of the plurality of channels is configured to direct a first airflow to an upper portion of the chassis, wherein a second channel of the plurality of channels is configured to direct a second airflow of the plurality of airflows to cool a set of memory components in a lower portion of the chassis.

8. The codesigned shroud of claim 1, wherein a first baffle of the plurality of baffles has a first height and a second baffle of the plurality of baffles has a second height, wherein a combined height of the first baffle height and the second baffle height is substantially equal to a height of the noise attenuation channel.

9. The codesigned shroud of claim 1, wherein at least one baffle of the plurality of baffles comprises a plurality of openings oriented perpendicular to the direction of the airflow.

10. The codesigned shroud of claim 1, further comprising a layer of acoustically absorbent material applied to one or more of the plurality of walls.

11. A chassis, comprising:
    a plurality of components;
    a plurality of fans generating a plurality of airflows to cool the plurality of components; and
    a codesigned shroud comprising:
      a plurality of walls defining a plurality of channels, wherein at least two walls of the plurality of walls define each channel of the plurality of channels, wherein each channel is substantially aligned with a direction of an airflow of the plurality of airflows; and
      a set of baffles in a noise attenuation channel of the plurality of channels, the set of baffles oriented substantially perpendicular to the direction of an airflow in the noise attenuation channel, wherein each baffle comprises acoustically absorbent material, wherein a first baffle of the set of baffles is offset from a second baffle of the set of baffles.

12. The chassis of claim 11, wherein each baffle comprises acoustically absorbent material configured to absorb acoustic energy in a frequency associated with a component.

13. The chassis of claim 12, wherein
    a component of the plurality of components is configurable to process information at a processing speed in a range of processing speeds;
    a fan produces the acoustic energy at a frequency of a range of frequencies,
    the component is subject to a decrease in the processing speed due to the acoustic energy produced at the frequency; and
    the acoustically absorbent material is configured to absorb at least a portion of the acoustic energy at the frequency.

14. The chassis of claim 13, wherein the component comprises a Hard Disk Drive (HDD).

15. The chassis of claim 11, wherein at least one channel of the plurality of channels is configured to direct an airflow of the plurality of airflows to cool a heat sink.

16. The chassis of claim 11, wherein at least one channel of the plurality of channels is configured to direct an airflow of the plurality of airflows to cool a set of memory components.

17. The chassis of claim 16, wherein a first channel of the plurality of channels is configured to direct a first airflow to an upper portion of the chassis, wherein a second channel of the plurality of channels is configured to direct a second airflow of the plurality of airflows to cool a set of memory components in a lower portion of the chassis.

18. The chassis of claim 11, wherein a first baffle of the plurality of baffles has a first height and a second baffle of the plurality of baffles has a second height, wherein a combined height of the first baffle height and the second baffle height is substantially equal to a height of the noise attenuation channel.

19. The chassis of claim 11, wherein at least one baffle of the plurality of baffles comprises a plurality of openings oriented perpendicular to the direction of the airflow.

20. The chassis of claim 11, further comprising a layer of acoustically absorbent material applied to one or more of the plurality of walls.

\* \* \* \* \*